(12) United States Patent
Asano et al.

(10) Patent No.: US 6,340,390 B1
(45) Date of Patent: Jan. 22, 2002

(54) METHOD FOR MANUFACTURING SILICON SINGLE CRYSTAL

(75) Inventors: Hiroshi Asano; Yukio Sugimoto; Fusao Tabata, all of Hyogo (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/585,466

(22) Filed: Jun. 2, 2000

(30) Foreign Application Priority Data

Dec. 1, 1998 (JP) .......................................... 10-341722

(51) Int. Cl.[7] .............................................. C03B 15/20
(52) U.S. Cl. ......................................................... 117/13
(58) Field of Search ........................................... 117/13

(56) References Cited

U.S. PATENT DOCUMENTS 5,129,986 A * 7/1992 Seki et al. ..................... 117/13
5,131,974 A * 7/1992 Oda et al. ..................... 117/13

* cited by examiner

Primary Examiner—Felisa Hiteshew
(74) Attorney, Agent, or Firm—Morrison & Foerster, LLP

(57) ABSTRACT

A method for manufacturing a silicon single crystal. In this method, silicon material melting is performed in a furnace having an internal pressure between 60 and 400 mbar. The subsequent single crystal pulling is performed in a furnace having an internal pressure which is lower than the pressure when the silicon material is molten, but not exceeding 95 mbar. This method prevents production of a defective single crystal which results from the formation of pinholes, prevents dislocation of the single crystal which results from bubbles and impurities present in silicon melting solution, and prevents dislocation of the single crystal which results from evaporation of the SiO.

1 Claim, 1 Drawing Sheet

METHOD FOR MANUFACTURING SILICON SINGLE CRYSTAL

FIELD OF THE INVENTION

The present invention relates to a method for manufacturing a silicon single crystal using a Czochralski (CZ) method.

BACKGROUND OF THE INVENTION

In a conventional Czochralski (CZ) method for manufacturing a silicon single crystal, a polycrystalline silicon material is molten in a quartz crucible which has been placed in a furnace. This process forms a silicon melting solution, alternatively referred to as a silicon melt. A seed crystal is then placed in the melting solution and removed from the solution while it and the crucible are being rotated, forming a silicon single crystal below the seed crystal. In this process, the internal pressure to vacuum level in the furnace is maintained at a low level, 25 mbar or less, and has an argon gas flowing from the top downward.

As the size of the silicon single crystal increases, a larger quartz crucible is needed to melt the polycrystalline material. A larger crucible requires more heat from the heater to maintain a temperature sufficiently high to melt the polycrystalline silicon material. Heating the polycrystalline material at a higher temperature yields an increased temperature of the silicon melting solution at the crucible wall, causing an increased vapor pressure of the bubbles (e.g., SiO bubbles) present in the melting solution.

The increased vapor pressure of the SiO bubbles accelerates the evaporation of SiO and increases the quantity of SiO deposited on the furnace structures housed over the melt. The deposits drop into the silicon melting solution being pulled, contaminating the solution and causing dislocation of the crystal. This accelerated evaporation of SiO from the silicon melting solution cannot be efficiently controlled in a conventional CZ low pressure process operating at a pressure of 25 mbar or less, and where the single crystal is pulled at 100 mbar or more. A higher pressure process prevents the single crystal from the dislocation which results when the SiO evaporates, but has its own disadvantages. For example, a higher pressure process retards the release of the bubbles and impurities in the silicon melting solution from the material's melting to completion of the single crystal pulling, but causes pinholes to form in the single crystal and increases the dislocation resulting from the bubbles and impurities.

A combination of low and high-pressure processes, in which the polycrystalline silicon material is molten at a low pressure, between 5 and 60 mbar, and the single crystal is pulled at a higher pressure, 100 mbar or more, is disclosed by Japanese Patent No. 2,635,456. Such a combination process has been used to address the problems associated with using either the high pressure process or the low pressure process for both melting and pulling. While conventional combination processes solve some of the problems of the high and low pressure processes, these combination processes have only moderately increased the single crystal yield.

Accordingly, a need exists for a method of manufacturing a silicon single crystal, which avoids the problems associated with using either a high-pressure process for both melting and pulling (e.g., formation of pinholes, and dislocation of the single crystal resulting from the bubbles and impurities) and those associated with using a low-pressure process for both melting and pulling (e.g., dislocation of the single crystal resulting from the evaporated SiO), while increasing the single crystal yield.

SUMMARY OF THE INVENTION

The present invention provides a method for manufacturing a silicon single crystal. In this method, the polycrystalline silicon material is molten in a furnace having a pressure maintained between 65 and 400 mbar, and the single crystal is pulled from a silicon melting solution at a lower pressure than that used to melt the silicon material.

Maintaining the pressure in the furnace between 65 and 400 mbar to melt the silicon material controls transformation of the quartz crucible into cristobalite and simultaneously increases the yield of the single crystal. At below 65 mbar, SiO evaporates from the silicon melting solution, causing dislocation of the single crystal and decreasing the single crystal yield. By contrast, at above 400 mbar, the inert gas flowing through the furnace may not be purged from the furnace. As a result, CO formed by the synthetic reaction between the evaporated SiO and the carbon members in the furnace remains in the furnace and contaminates the silicon melting solution, thereby increasing the number of silicon single crystal lots containing high amounts of carbon. The preferable pressure in the furnace while the silicon material is molten ranges between 120 and 200 mbar.

In the single-crystal pulling step, the pressure in the furnace should be maintained at a level not exceeding 95 mbar. At above 95 mbar, the bubbles and impurities which form from the silicon melting solution do not completely evaporate and cause formation of pinholes and dislocation of the single crystal. While the lowest acceptable pressure level in the furnace during the pulling step includes any level which is lower than that used in the material melting step and is less than 95 mbar, such level is preferably at least 10 mbar because at a pressure level less than 10 mbar, the SiO evaporates at an accelerated rate, causing dislocation of the single crystal.

The method of the present invention for manufacturing silicon single crystal is particularly suitable for a material charge of 120 kg or more and a single crystal diameter of 8 inches or more, where transformation of the crucible's inner surface into cristobalite becomes a problem.

DETAILED DESCRIPTION OF THE INVENTION

Figure 1:
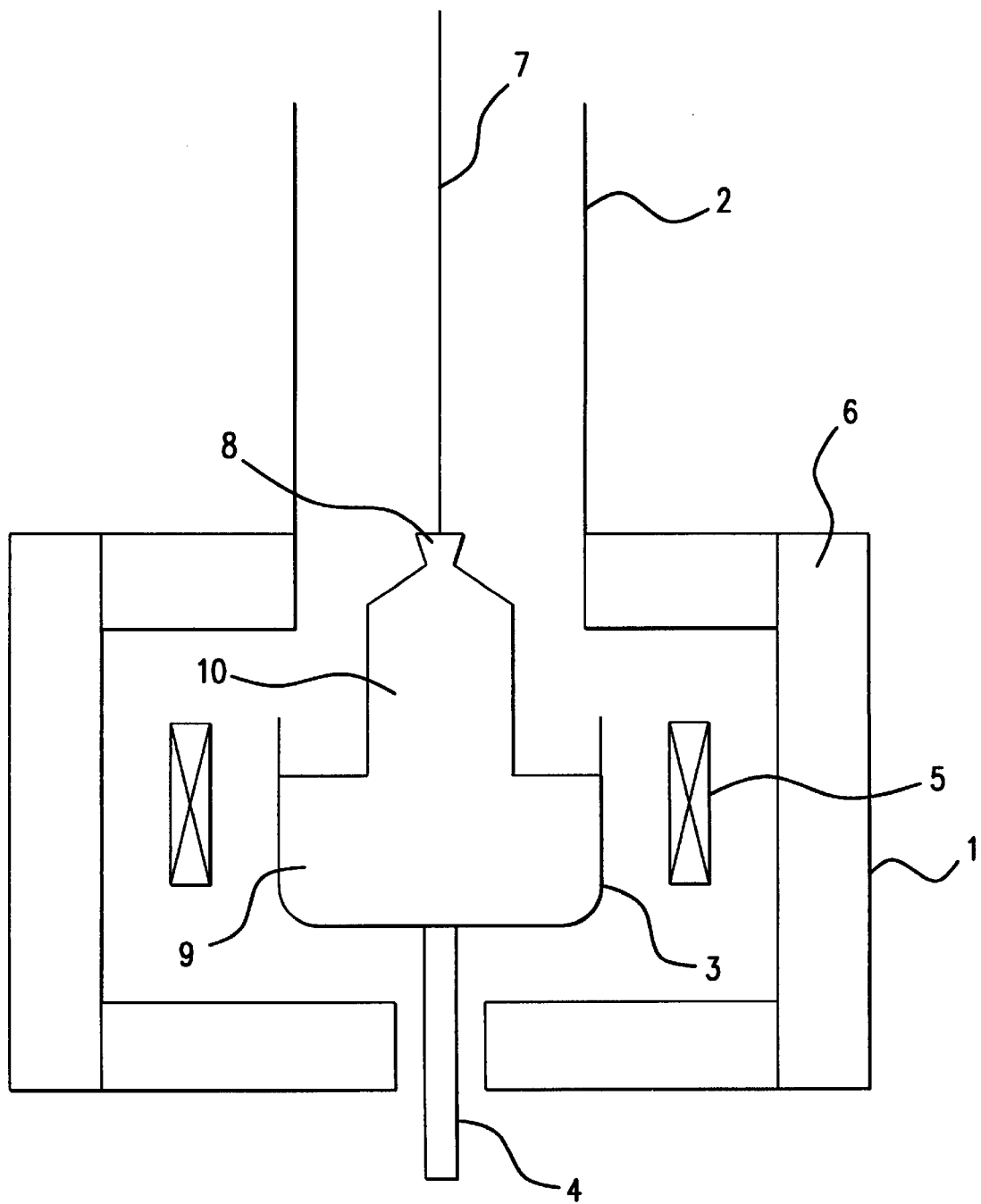
FIG. 1 illustrates a furnace suitable for manufacturing a silicon single crystal using the method of the present invention.

The present invention provides a method for manufacturing a silicon single crystal which overcomes the prior art problems associated with the high-pressure, low-pressure, and combination processes for melting and pulling. This method includes melting the silicon material at a high pressure in order to control the transformation of the quartz crucible into cristobalite. More specifically, in this method, a polycrystalline silicon material is molten in a furnace having a pressure between 65 and 400 mbar, and the single crystal is pulled from the silicon melting solution at a lower pressure, but not less than 10 mbar.

During the melting process, a polycrystalline silicon material is heated to a sufficiently high temperature to be molten and form a melting solution. As a result, the melting solution tends to be 50 to 60° C. higher in temperature during the melting process than during the pulling-up process. When this hot melt comes into contact with the quartz crucible during the pulling process, crystallization of its surface into cristobalite is accelerated. Once the crucible surface has been transformed into cristobalite, it breaks off into the silicon melting solution and causes dislocation of the single crystal.

Transformation of the quartz crucible into cristobalite is accelerated during the material melting process as the pressure in the furnace decreases. It is therefore important to control transformation of the crucible surface into cristobalite, particularly during the material melting process in which the silicon melting solution is at a higher temperature than at any other step in the silicon single crystal manufacturing process. This increases the single crystal yield.

The problems involved in the high-pressure process for melting and pulling (e.g., formation of pinholes, and dislocation of the single crystal resulting from the bubbles and impurities) greatly depend on the pressure in the furnace during the single crystal pulling step. These problems can be controlled even when the bubbles and impurities are not extensively released from the melting solution during the material melting process by releasing them in the subsequent single crystal pulling process. Thus, pulling the single crystal when the pressure is low causes the bubble/impurity releasing effects similar to those associated with use of the low-pressure process for both the melting and pulling processes.

On the other hand, the problems which occur when a low-pressure process is used for both melting and pulling (e.g., dislocation of the single crystal resulting from the evaporated SiO) are primarily related to the melting process because during pulling, the SiO evaporates at a lower temperature and can therefore be controlled. When the material is melted at a higher temperature, the SiO evaporates at an accelerated rate and leaves deposits on the furnace structures over the melt. The deposits may drop into, and contaminate silicon melting solution being pulled. Therefore, melting the material at a higher temperature (i.e., with increased pressure) controls dislocation of the single crystal resulting from the evaporated SiO. This result is similar to that achieved when using a high pressure process for both the melting and pulling steps.

FIG. 1 illustrates a furnace for practicing the method of manufacturing a silicon single crystal of the present invention.

The furnace is characterized by the structure with a small pull chamber 2 placed on a large main chamber 1. The main chamber 1 holds a crucible 3, set at the center. The crucible 3 has a double-layered structure, with an inner quartz crucible being reinforced by an outer graphite crucible, and is set on a support shaft 4, which may also be referred to as pedestal. The support shaft 4 is driven in the peripheral or axial direction to cause rotational or vertical motion of the crucible 3. The crucible 3 is surrounded by a heater 5, and the inner walls of the main chamber 1 are lined with an insulator 6.

When manufacturing a silicon single crystal, the furnace is maintained at a specified pressure, between 65 and 400 mbar while the silicon is melted, an argon gas is passed downward, and the gases inside the furnace are driven off under a vacuum. In such a state, the polycrystalline silicon material in the crucible 3 is molten by heat from the heater 6 around the crucible 3 to form a silicon melting solution 9.

After the silicon material has been melted, the seed crystal 8, mounted on the lower end of the pulling shaft 7 and hung in the main chamber 1 via the inside of the pull chamber 2, is put in the silicon melting solution 9 in the crucible 3, and then pulled while the shaft 7 is rotated. The silicon single crystal 10 grows below the seed crystal 8. While the silicon single crystal 10 is pulled, the crucible 3 is raised while being rotated to keep the level of the melting solution constant. During this step, the internal furnace pressure is maintained at 95 mbar or less, a lower pressure than during the melting process.

The following examples clarify the effects of the present invention by comparing the results of manufacturing a silicon single crystal according to the method of the present invention with traditional and comparative methods. In the examples, 130 kg of the polycrystalline silicon material was molten, and a silicon single crystal (diameter: 8 inches, and target length: 1,400 mm) was pulled therefrom, under varying internal furnace pressure levels during melting and pulling. The total length pulling ratio, i.e., the ratio of the number of silicon single crystal samples pulled-up to the total length, and the defective single crystal lot ratio were observed for each run. The defective sample is defined as the sample having pinholes. Table 1 depicts these ratios along with the internal furnace pressure level during the material melting and single crystal pulling processes. The total length pulling ratio represents the single crystal yield, which varies with transformation of the crucible into evaporation of SiO. The defective single crystal lot ratio represents the evaporation efficiency of the bubbles and the impurities present in silicon melting.

Run A represents a traditional example (traditional example 1), where both the material melting and single crystal pulling processes were performed at a low pressure. At a charge of 130 kg, the crucible was transformed into cristobalite and SiO was evaporated significantly, to greatly decrease single crystal yield. Run B represents another traditional example (traditional example 2), where both the material melting and single crystal pulling processes were effected at a high pressure. The decrease in the single crystal yield was greatly suppressed in spite of a high charge of 130 kg. However, the evaporation of the bubbles and impurities from the silicon melting solution was insufficient, causing the formation of pinholes in the silicon single crystal and increasing the defective ratio to a level nearly twice as high as that in traditional example 1.

Run C represents still another traditional example (traditional example 3), where the material melting process was performed at a low pressure and the single crystal pulling process was performed at a higher pressure. The single crystal yield of Run C is significantly lower than that of traditional example 2, indicating a decrease to a level comparable to that of traditional example 1 due to insufficient evaporation of the bubbles and impurities from silicon melting solution during the pulling process. The defective ratio is higher than that of traditional example 2 due to increased evaporation of the bubbles and impurities of the silicon melting solution.

Runs D to G represent examples of the present invention where the material melting process was effected at a high pressure and the single crystal pulling process at a lower pressure. Their single crystal yields are significantly higher than that of traditional example 1, increasing to a level comparable to that of traditional example 2. This is particularly apparent in Example 4 where the material melting step was effected at a higher pressure than in the other examples, and the single crystal pulling process was effected at a significantly lower pressure than was the material melting process. The extent of evaporation of the bubbles and impurities in all of these examples is on a level comparable to that of traditional example 1.

Run H represents a comparative example where the material melting step was effected at a lower pressure than was the same step for the present invention, although the single crystal pulling step was effected at a lower pressure than was the material melting step. Although the ratio of defective lots resulting from pinhole formation decreased, the single crystal yield also significantly decreased because of massive dislocation of the single crystal resulting from transformation of the crucible into cristobalite. Run I represents another comparative example where the material melting step was effected at a higher pressure than was the same process for the present invention, although the single-crystal pulling process was effected at a lower pressure than was the material melting process. A fairly high pressure inside the furnace when the material is being melted controls evaporation of the bubbles and impurities. Therefore, the ratio of defective lots resulting from the formation of pinholes increased, and the inert gas flowing downward in the furnace could not efficiently be exhausted from the furnace. Thus, the CO gas contained in the emission gas in the furnace was included in silicon melting solution, which notably increased the carbon content of the single crystal. Run J represents another comparative example where the single crystal pulling process was effected at a higher pressure than it was in the present invention although the material melting process was effected at a higher pressure than was the single crystal pulling process.

TABLE 1

| | Internal furnace pressure | | | Ratio of defective single | |
| | Material melting step | Single-crystal pulling step | Total length pulling ratio | crystal caused by formation of pinholes | Examples |
| --- | --- | --- | --- | --- | --- |
| A | 25 mbar | 13–40 mbar | 45.8% (44/96) | 4.6% (14 Lot/307 Lot) | Traditional Example 1 |
| B | 120 mbar | 120 mbar | 84.6% (11/13) | 9.2% (7 lot/76 Lot) | Traditional Example 2 |
| C | 25 mbar | 120 mbar | 46.7% (7/15) | 6.7% (3 lot/45 lot) | Traditional Example 3 |
| D | 65 mbar | 13–40 mbar | 51.0% (26/51) | 5.5% (10 Lot/182 Lot) | Example 1 |
| E | 120 mbar | 13–40 mbar | 73.9% (51/69) | 5.1% (18 Lot/356 Lot) | Example 2 |
| F | 120 mbar | 65–95 mbar | 81.0% (47/58) | 5.5% (18 Lot/329 Lot) | Example 3 |
| G | 400 mbar | 65–95 mbar | 90.6% (29/32) | 6.9% (14 Lot/203 Lot) | Example 4 |
| H | 50 mbar | 13–40 mbar | 47.1% (8/17) | 5.3% (3 Lot/56 Lot) | Comparative Example 1 |
| I | 500 mbar | 65–95 mbar | 88.2% (15/17) | 9.5% (10 Lot/105 Lot) | Comparative Example 2 |
| J | 400 mbar | 150 mbar | 82.4% (14/17 | 10.3% (10 Lot/97 Lot) | Comparative Example 3 |

As described above, the examples which are consistent with the method of the present invention produce an increased single crystal yield and control the formation of pinholes by effecting the material melting process at an adequately high pressure and effecting the single crystal pulling process at a lower pressure.

As described above, the method of the present invention for manufacturing a silicon single crystal solves the problems of a high-pressure process for melting and pulling (e.g., formation of pinholes) and, at the same time, controls the problems of a low-pressure process for melting and pulling (e.g., dislocation of the single crystal resulting from the evaporated SiO and transformation of the crucible surface into cristobalite) by performing the material melting process at an adequately high pressure and the single crystal pulling process at a lower pressure.

Although the foregoing description has been described with reference to a specific implementation, those skilled in the art will know of various changes in form and detail which may be made without departing from the spirit and scope of the present invention as defined in the appended claims and the full scope of their equivalents.

What is claimed is:

1. A method for manufacturing a silicon single crystal using a Czochralski method, comprising:

melting a polycrystalline silicon material in a furnace having an internal pressure between 65 and 400 mbar, wherein a silicon melting solution is formed; and pulling the silicon single crystal from the melting solution when the internal furnace pressure is both less than 95 mbar and less than the internal pressure during the melting.

* * * * *